US012774526B2

(12) United States Patent
Kalita et al.

(10) Patent No.: US 12,774,526 B2
(45) Date of Patent: Oct. 27, 2026

(54) ADVANCED BARRIER NICKEL OXIDE (BNiO) COATING DEVELOPMENT FOR THE PROCESS CHAMBER COMPONENTS

(71) Applicant: APPLIED MATERIALS, INC., Santa Clara, CA (US)

(72) Inventors: Laksheswar Kalita, San Jose, CA (US); Joseph Behnke, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/594,802

(22) Filed: Mar. 4, 2024

(65) Prior Publication Data

US 2024/0352589 A1 Oct. 24, 2024

Related U.S. Application Data

(62) Division of application No. 17/449,844, filed on Oct. 4, 2021, now abandoned.

(51) Int. Cl.

| | |
|---|---|
| ***C23C 18/32*** | (2006.01) |
| ***C23C 18/16*** | (2006.01) |
| ***H01J 37/32*** | (2006.01) |

(52) U.S. Cl.

CPC .......... *C23C 18/32* (2013.01); *C23C 18/1637* (2013.01); *C23C 18/1639* (2013.01); *C23C 18/1689* (2013.01); *H01J 37/32495* (2013.01)

(58) Field of Classification Search

CPC . C23C 18/1639; C23C 18/32; C23C 18/1689; C23C 18/1637; C23C 22/56; C23C 22/34; H01J 37/32495

See application file for complete search history.

(56) References Cited

U.S. PATENT DOCUMENTS

| | | | | |
|---|---|---|---|---|
| 3,574,930 A * | 4/1971 | Riddel | H01C 7/041 29/621 |
| 4,167,416 A | 9/1979 | Zolla | |
| 4,659,379 A * | 4/1987 | Singh | C23C 8/80 419/33 |
| 5,344,425 A * | 9/1994 | Sawyer | A61F 2/88 606/198 |
| 5,849,170 A | 12/1998 | Djokic et al. | |
| 5,952,718 A | 9/1999 | Ohtsuka et al. | |

(Continued)

FOREIGN PATENT DOCUMENTS

| | | |
|---|---|---|
| CN | 105261491 * | 1/2016 |
| JP | S61253383 A | 11/1986 |

(Continued)

OTHER PUBLICATIONS

International Search Report and Written Opinion for International Application No. PCT/US2022/045268, mailed Feb. 2, 2023, 11 Pages.

(Continued)

*Primary Examiner* — Katherine A Bareford
(74) *Attorney, Agent, or Firm* — Lowenstein Sandler LLP

(57) ABSTRACT

Described herein is a chamber component including a metal layer comprising nickel and a barrier layer of nickel oxide over the metal layer. The barrier layer of nickel oxide may be formed by treating the chamber component with an oxidizing agent comprising hydrofluoric acid and/or nitric acid

13 Claims, 6 Drawing Sheets

(56) References Cited

U.S. PATENT DOCUMENTS

| | | | | |
|---|---|---|---|---|
| 6,280,597 | B1 | 8/2001 | Kashiwada et al. | |
| 2002/0093101 | A1 | 7/2002 | Iyer et al. | |
| 2003/0106793 | A1 | 6/2003 | Sirkis et al. | |
| 2004/0045503 | A1 | 3/2004 | Lee et al. | |
| 2005/0155625 | A1* | 7/2005 | Jangjian | B08B 7/00 134/1.1 |
| 2005/0249618 | A1* | 11/2005 | Nonaka | F04D 19/04 417/423.4 |
| 2006/0228569 | A1 | 10/2006 | Kojima et al. | |
| 2007/0203041 | A1* | 8/2007 | Lee | C11D 3/3947 510/375 |
| 2009/0140262 | A1 | 6/2009 | Ohki et al. | |
| 2011/0101076 | A1 | 5/2011 | Ogaki et al. | |
| 2012/0037930 | A1* | 2/2012 | Hoppel | H01L 33/44 438/33 |
| 2012/0220116 | A1* | 8/2012 | Noori | H01L 29/517 438/591 |
| 2013/0115778 | A1* | 5/2013 | Xue | H01L 21/31144 257/E21.252 |
| 2015/0110965 | A1 | 4/2015 | Brunner et al. | |
| 2016/0002811 | A1 | 1/2016 | Sun et al. | |
| 2018/0080888 | A1 | 3/2018 | Nazarian | |
| 2018/0330923 | A1* | 11/2018 | Tran | C23C 16/04 |
| 2019/0323127 | A1* | 10/2019 | Kalita | C23C 18/36 |
| 2021/0032745 | A1 | 2/2021 | Enman et al. | |
| 2023/0287568 | A1* | 9/2023 | Kalita | C23C 18/1696 |

FOREIGN PATENT DOCUMENTS

| | | | |
|---|---|---|---|
| JP | H10312976 | A | 11/1998 |
| JP | H1192912 | A | 4/1999 |
| JP | 2003342752 | A | 12/2003 |
| JP | 2004-360066 | * | 12/2004 |
| JP | 2004360066 | A | 12/2004 |
| JP | 2005089860 | A | 4/2005 |
| JP | 2006283141 | A | 10/2006 |
| JP | 2010-006010 | * | 1/2010 |
| JP | 2013256686 | A | 12/2013 |
| KR | 19980071010 | A | 10/1998 |
| TW | 201842228 | A | 12/2018 |
| WO | 2005014881 | A2 | 2/2005 |
| WO | 2020/196061 | * | 10/2020 |
| WO | 2020196061 | A1 | 10/2020 |

OTHER PUBLICATIONS

International Search Report and Written Opinion for International Application No. PCT/US2023/011367, mailed May 24, 2023, 11 pages.

International Search Report and Written Opinion for International Application No. PCT/US2023/11367, mailed May 24, 2023, 9 pages.

Kim Y., et al., "Preparation of Nickel Oxide Films by Anodizing," Korean Chemical Engineering Research, Apr. 2012, vol. 50, No. 2, pp. 204-210.

Non-Final Office Action for U.S. Appl. No. 17/449,844, mailed Dec. 5, 2023, 24 Pages.

Non-Final Office Action for U.S. Appl. No. 17/692,351, mailed May 22, 2025, 12 Pages.

* cited by examiner

FIG. 5
500
START
Clean Chamber Component with Contamination Layer in a First Bath 502
Rinse Chamber Component and Then Dry Chamber Component 504
Clean Chamber Component in a Second Bath 506
Rinse Chamber Component and Then Dry Chamber Component 508
Polish Chamber Component 510
Perform Oxidation Treatment on Chamber Component 512
END

ADVANCED BARRIER NICKEL OXIDE (BNiO) COATING DEVELOPMENT FOR THE PROCESS CHAMBER COMPONENTS

CROSS REFERENCE TO RELATED APPLICATION(S)

The present application is a Divisional Application of U.S. patent application Ser. No. 17/449,844, filed on Oct. 4, 2021, now abandoned, the entire contents of which are incorporated herein in its entirety.

TECHNICAL FIELD

Embodiments of the present disclosure relate, in general, to erosion resistant metal oxide coated chamber components and methods of forming and using such coated chamber components.

BACKGROUND

In the semiconductor industry, devices are fabricated by a number of manufacturing processes producing structures of an ever-decreasing size. As device geometries shrink, controlling the process uniformity and repeatability of devices becomes much more challenging.

Various semiconductor manufacturing processes use high temperatures, high energy plasma (such as remote and direct fluorine plasma such as $NF_3$, $CF_4$, and the like), a mixture of corrosive gases, corrosive cleaning chemistries (e.g., hydrofluoric acid) and combinations thereof. These extreme conditions may result in a reaction between materials of components within the process chamber and the plasma or corrosive gases to form metal fluorides, particles, other trace metal contaminates and high vapor pressure gases (e.g., $AlF_x$). Such gases may readily sublime and deposit on other components within the chamber. During a subsequent process step, the deposited material may release from the other components as particles and fall onto the wafer causing defects. Additional issues caused by such reactions include deposition rate drift, etch rate drift, compromised film uniformity, and compromised etch uniformity. It is beneficial to reduce these defects with a stable, non-reactive coating on chamber components to limit the sublimation and/or formation of particles and metal contaminants on the chamber components within the chamber.

Hence, certain semiconductor processing chamber components (e.g., liners, doors, lids, shower heads and so on) include an electroless nickel plated (ENP) surface to reduce these defects. However, the ENP surface has been found to develop a fluorine-containing layer after use in a fluorine-based atmosphere and at higher temperatures of about 150° C. or above. Without being limited to a theory, the fluorine-containing layer develops because of contamination during use, thus the fluorine-containing layer can be considered a contamination layer. Further, after processing a few hundreds of wafers, it has been found that the fluorine-containing layer lessens the lifetime of one or more components of the process chamber and a mean wafers between cleaning (MWBC) metric.

SUMMARY

In some embodiments of the present disclosure, a chamber component for a processing chamber may include a body; a metal plating on at least one surface of the body, the metal plating comprising nickel; and a barrier layer on the metal plating. In some embodiments, the barrier layer may include a nickel oxide. In some embodiments, the metal plating may include nickel and phosphorus. In some embodiments, the metal plating may include nickel and is free of phosphorous. In some embodiments, the body includes aluminum, an aluminum alloy, aluminum nitride, alumina, or combinations thereof. In some embodiments, the metal plating has a thickness of about 20 microns to about 75 microns, and the barrier layer has a thickness of about 2 nm to about 50 nm. In some embodiments, the barrier layer has an average surface roughness (Ra) of about 2 micro-inches to about 60 micro-inches. In some embodiments, the chamber component may be a showerhead for a process chamber.

In other embodiments of the present disclosure, a method of protecting a chamber component includes forming a metal plating on a body of the chamber component, wherein the metal plating may include nickel, and contacting the metal plating with an oxidizing agent to form a barrier layer on the metal plating, wherein the barrier layer may include nickel oxide. In some embodiments, the oxidizing agent may include one of at least one of hydrofluoric acid, oxalic acid, or nitric acid. In some embodiments, the barrier layer may have a thickness from about 2 μm to about 60 μm. In some embodiments, forming the metal plating may include performing electroless metal plating, and wherein the metal plating further comprises phosphorus. In some embodiments, the body may include an aluminum alloy, aluminum nitride, alumina, or combinations thereof. In some embodiments, the method may include removing a native oxide from the metal plating prior to forming the barrier layer. In some embodiments, the method may include after the forming the metal playing, forming a nickel fluoride (NiF2) or nickel oxy-fluoride layer on the metal plating by contacting the metal plating with ammonium fluoride. In some embodiments, the method may also include placing the chamber component in an acid bath comprising 5-25% hydrofluoric acid and 75-95% water to contact the metal plating with the oxidizing agent; subsequently placing the chamber component in a de-ionized water bath; subsequently placing the chamber component in the acid bath; and subsequently placing the chamber in the di-ionized water bath.

In another embodiment of the present disclosure, a method of refurbishing a used chamber component may include removing a contamination layer from a metal plating on the used chamber component using a first acid solution, wherein the metal plating comprises nickel; and subsequently contacting the metal plating with an oxidizing agent to form a barrier layer on the metal plating, wherein the barrier layer comprises nickel oxide. In some embodiments, the contamination layer may include nickel fluoride. In some embodiments, the removing the contamination layer may include placing the used chamber component in a first acid bath, subsequently rinsing the used chamber component with deionized water, subsequently drying the used chamber component, subsequently placing the used chamber component in a second acid bath, subsequently rinsing the used chamber component with deionized water, and subsequently drying the used chamber component. In some embodiments, the oxidizing agent may include at least one of hydrofluoric acid or nitric acid. In some embodiments, the barrier layer may have a thickness from about 2 μm to about 60 μm.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1A:
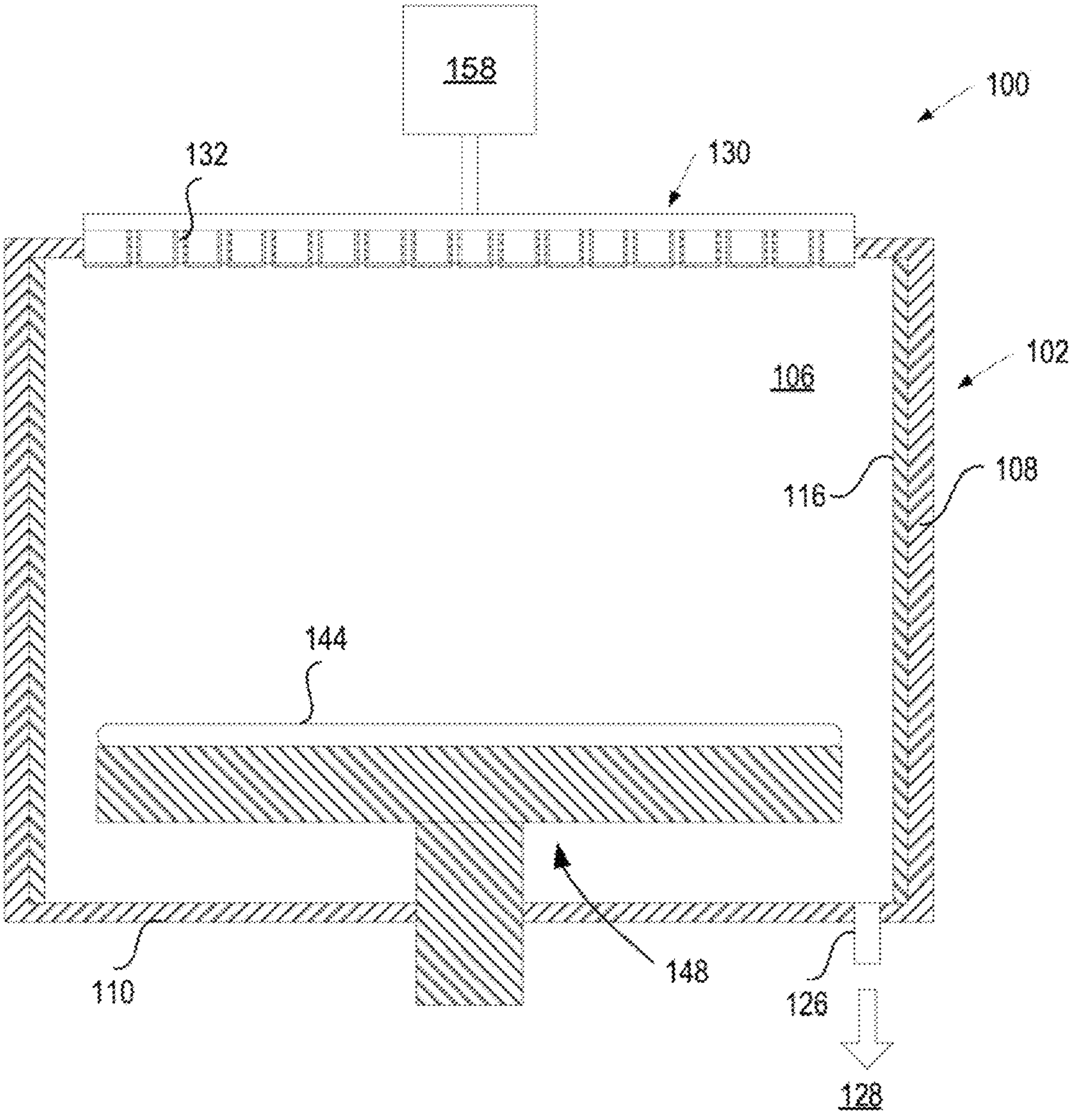
FIG. 1A depicts a sectional view of one embodiment of a processing chamber.

Embodiments disclosed herein describe coated articles, coated chamber components, methods of coating articles and chamber components, methods of reducing or eliminating particles from semiconductor processing chambers, and methods of using coated articles and chamber components and processing chambers containing coated chamber components. To reduce reactions between component materials and reactive chemicals and/or plasmas, which form metal fluorides, particles, other trace metal contaminates and/or high vapor pressure gases, a metal layer (e.g., which may be a metal coating or metal plating) with a barrier layer is included. The metal layer may be a nickel-containing layer (e.g., a pure nickel layer or a layer having nickel as a primary constituent and additionally including other materials such as phosphorous and/or vanadium). The barrier layer may be a nickel oxide layer formed under controlled conditions. The barrier layer may be added to new chamber components to improve a lifespan of the chamber components and/or to reduce or eliminate a buildup of a contamination layer on the chamber component. Further, to improve the life of the coated articles or coated chamber components (which may be new or used chamber components), they may be treated to remove a contamination layer and to add a barrier layer over a metal layer on the chamber components.

It has been found that there is an interaction between fluorine and a metal layer (e.g., an ENP comprising nickel) on chamber components that adds oxides and/or fluorides to the metal layer. A native oxide naturally occurs on the metal layer due to exposure to air. However, the native oxide has undesirable properties. In particular, the native oxide interacts with process gases (e.g., fluorine) to form a contamination layer. The native oxide's interaction with fluorine causes discoloration and forms a black film (contamination layer) over the metal coating that produces particles that can contaminate processed substrates. If a black film/contamination layer is present on a chamber component such as a shower head, there may be a drop in yield for substrates processed by the process chamber that includes the shower head having the contamination layer.

Further, if there is a black film/contamination layer that forms while the chamber component is in use, the chamber component is removed and replaced.

Thus, embodiments improve the surface of chamber components such as showerheads to prevent the formation of the black film/contamination layer over a metal layer of the chamber components. It would be advantageous to have a protective barrier layer to prevent the chemical degradation of the surface metal layer and formation of the black film/contamination layer. Such a chamber component having a protective barrier layer may also degrade and/or become contaminated more slowly than a chamber component lacking the barrier layer, which may cause the chamber component with the barrier layer over the metal layer to have a higher mean wafers between cleaning than a chamber component with a metal layer and lacking the barrier layer. The mean wafers between cleaning represents the mean number of wafers that are processed between each cleaning of the chamber component. Such an increased mean wafers between cleaning may be particularly pronounced for chamber components used in chambers that perform processes at higher temperatures of about 200° C. or above.

In embodiments disclosed herein are chamber components for processing chambers and/or processing chambers containing such chamber components (e.g., semiconductor processing chambers), wherein the chamber components include a chamber component and a metal layer (e.g., a metal plating or a metal coating) on at least one surface of the chamber component. The metal layer may include an advanced barrier layer in embodiments.

In some embodiments, a chamber component may include a metal layer on a surface of the substrate. The chamber component or portions thereof may be composed of, without limitation, one or more of a metal, for example, aluminum, stainless steel and/or titanium, a ceramic, for example, alumina, silica and/or aluminum nitride, and/or combinations thereof. The metal layer may be an electroless metal plating including nickel or an electrolytic metal plating including nickel.

In some embodiments, a chamber component may be plated using an electroless plating process to form an electroless metal plating on one or more surface of the chamber component. In embodiments, the electroless metal plating may be a nickel-phosphorous plating. The electroless plating process can form a metal plating directly on the surface of the chamber component. In some embodiments, the chamber component may be plated using an electrolytic metal plating process. For example, the electrolytic plating process may form a layer containing nickel, silver and/or gold. In some embodiments, one or more surface of the chamber component may be coated using a sputtering process, such as a sputtering process that sputters a nickel-containing coating onto the one or more surface of the chamber component. The nickel containing coating may include, for example, 98-99 atomic % nickel and 1-2 atomic % vanadium.

In some embodiments, when the chamber component is coated with an electroless plating process, the chamber component is placed in a bath that contains nickel and phosphorous. The bath may include about 84% nickel and about 16% phosphorous, about 86% nickel and 14% phosphorous, about 88% nickel and about 12% phosphorous, about 90% nickel and about 10% phosphorous, about 92% nickel and about 8% phosphorous, about 94% nickel and about 6% phosphorous, and about 96% nickel and about 4% phosphorous. For example, the bath may include about 84-96% nickel and about 4-16% phosphorous.

In some embodiments, when the chamber component is plated with an electrolytic metal plating process, the coating is free of phosphorous. For example, the plating may be 100% nickel. In some embodiments, the chamber component is coated with a sputtered nickel. The sputtered nickel, as understood by one of skill in the art, may include nickel and vanadium. The vanadium may be present in the sputtered nickel in about 1% to about 2%.

In embodiments, when the chamber component includes a metal layer that is an electroless nickel plating or an electrolytic Ni plating, the layer may be in a thickness from about 20 microns to about 75 microns, from about 25 microns to about 70 microns, from about 30 microns to 60 microns, or from about 35 microns to about 50 microns.

In some embodiments, the metal layer may have a hardness from about 450 HV to about 500 HV. The roughness of the metal layer may be less than 50μ inch in embodiments.

The thickness of the metal layer formed by electroless plating may be targeted based on the amount of time that the chamber component is in the bath. The chamber component may be in the bath for about one minute to about three minutes to form the metal layer having a target thickness.

In some embodiments, a contamination layer may be found on the metal layer. The contamination layer may include a combination of nickel, fluorine and/or oxygen. In embodiments, the metal layer is a nickel layer that becomes slowly fluorinated over time due to exposure to fluorine-rich chemistries. For example, a contamination layer of nickel fluorine and/or nickel oxy-fluorine may be formed on the surface of the metal layer. The contamination layer may react to process gases differently than the metal layer, and may cause subtle changes to process chemistries. Additionally, or alternatively, the contamination layer may flake off of the chamber component and/or cause particle contamination on substrates processed in the process chamber in which the chamber component is installed. As a result, periodic maintenance may be performed on chamber components to remove those chamber components that include the contamination layer and to replace the removed chamber components with new chamber components that lack the contamination layer.

In embodiments, the chamber component includes a barrier layer comprising nickel oxide over a metal layer (e.g., a nickel layer). In embodiments, the formation of the barrier layer (e.g., the nickel oxide barrier layer) on the metal layer protects the metal layer from attack by process gases, and in particular to attack by fluorine-containing plasmas and other fluorine-containing chemistries. Accordingly, the barrier layer may be referred to as a protective layer. The nickel oxide barrier layer may be formed using an oxidation process, which may include immersing the chamber component (or a portion thereof that is to have a nickel oxide barrier layer) into a bath containing an oxidation agent (e.g., a bath containing hydrofluoric acid and/or nitric acid with water).

In some embodiments, the chamber component includes generating a nickel fluorination ($NiF_2$) or nickel oxy-fluorination (NiOF) layer after removing the contamination layer and before forming the barrier layer. The nickel fluorination or nickel oxy-fluorination layer may be generated by placing the metal plated chamber component in a bath with an ammonium fluoride ($NH_4F$) solution. The ammonium fluoride solution may have a concertation from about 0.5 M to about 3 M. The metal plated chamber component remains in the bath for about 5 minutes to about 60 minutes at a temperature of about 35 to about 45° C. to form a nickel fluorinated or nickel oxy-fluorinated layer. If a nickel fluorinated layer is formed, then Ni is present in an amount of abut 60 wt. % and F is present in an amount of about 40 wt. %. If a nickel oxy-fluorinated layer is formed, then Ni is present in an amount of about 62 wt. %, F is present in an amount of about 20 wt %, and O is present in an amount of about 17 wt. %. After this nickel fluorination ($NiF_2$) or nickel oxy-fluorination (NiOF) layer is formed then the nickel oxide barrier layer may be formed using an oxidation process as described herein.

Experimentation has shown that use of the nickel oxide barrier layer over a nickel layer on chamber components increases the serviceable lifetime of the chamber components by ten times. Accordingly, preventative maintenances may be reduced by two times up to ten times in embodiments as compared to the number and/or frequency of preventative maintenances performed to service and/or replace chamber components having an exposed nickel layer.

Some embodiments are descried herein with reference to a showerhead, and are particularly useful for coating chamber components having both high aspect ratio features and regions that are directly exposed to bombardment by a plasma. However, the barrier layer described herein can also be beneficially used on many other chamber components having metal layers that are exposed to plasma, such as chamber components for a plasma etcher (also known as a plasma etch reactor) or other processing chambers including walls, liners, bases, rings, view ports, lids, nozzles, substrate holding frames, electrostatic chucks (ESCs), face plates, selectivity modulation devices (SMDs), plasma sources, pedestals, and so forth.

Moreover, embodiments are described herein with reference to plated or coated chamber components and other articles that may cause reduced particle contamination when used in a process chamber for plasma rich processes. However, it should be understood that the plated or coated articles discussed herein may also provide reduced particle contamination when used in process chambers for other processes such as non-plasma etchers, non-plasma cleaners, chemical vapor deposition (CVD) chambers, physical vapor deposition (PVD) chambers, and so forth.

Referring now to the figures, FIG. 1A is a sectional view of a processing chamber 100 (e.g., a semiconductor processing chamber) having one or more chamber components that include a metal layer and a nickel oxide-containing barrier layer over the metal layer in accordance with embodiments of the present disclosure. The processing chamber 100 may be used for processes in which a corrosive plasma environment and/or corrosive chemistry is provided. For example, the processing chamber 100 may be a chamber for a plasma etch reactor (also known as a plasma etcher), a plasma cleaner, an atomic layer deposition (ALD) chamber that performs plasma-enhanced ALD, other deposition chambers, and so forth. Examples of chamber components that may include a metal layer and a barrier layer over the metal layer are a substrate support assembly 148, an electrostatic chuck (ESC), a ring (e.g., a process kit ring or single ring), a chamber wall, a base, a showerhead 130, a gas distribution plate, a liner, a liner kit, a shield, a plasma screen, a flow equalizer, a cooling base, a chamber viewport, a chamber lid, a nozzle, process kit rings, and so on.

In one embodiment, the metal layer is a nickel-containing layer (e.g., 100% nickel or nickel in combination with one or more additional materials such as phosphorous and/or vanadium). In one embodiment, the barrier layer is a nickel-oxide containing layer (e.g., 100% nickel oxide or nickel oxide with one or more additional materials such as phosphorous and/or vanadium). The metal layer and the barrier layer may be conformal thin films.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. Any of the showerhead 130 (or lid and/or nozzle), sidewalls 108 and/or bottom 110 may include the multi-layer plasma resistant coating.

An outer liner 116 may be disposed adjacent the sidewalls 108 to protect the chamber body 102. The outer liner 116 may be a halogen-containing gas resist material such as $Al_2O_3$ or $Y_2O_3$. The outer liner 116 may be coated with the multi-layer plasma resistant ceramic coating in some embodiments.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. The showerhead 130 includes multiple gas delivery holes 132 throughout the showerhead 130. The showerhead 130 may be or include aluminum, anodized aluminum, an aluminum alloy (e.g., Al 6061), or an anodized aluminum alloy. In some embodiments, the showerhead includes a gas distribution plate (GDP) bonded to the showerhead. The GDP may be, for example, Si or SiC. The GDP may additionally include multiple holes that line up with the holes in the showerhead.

Figure 1B:
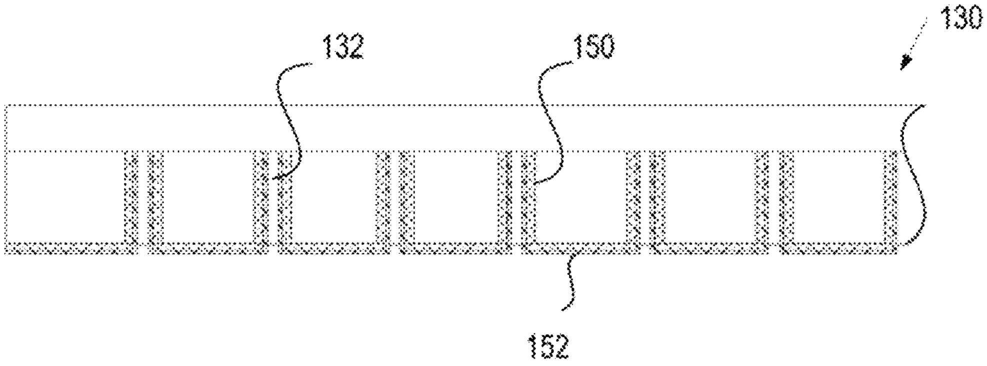
FIG. 1B depicts a sectional view of one embodiment of a showerhead for a processing chamber.

FIG. 1B illustrates a zoomed in view of a portion of the showerhead 130 of FIG. 1A. With reference to FIG. 1B, in embodiments the showerhead 130 is coated by a metal layer 150 and a barrier layer 152. In particular, in some embodiments a surface of the showerhead and walls of holes 132 in the showerhead are coated by a thin conformal metal layer 150. Additionally, the backside of the showerhead 130 and outer side walls of the showerhead may also be coated by the conformal metal layer 150. A non-line of sight deposition technique such as ALD or plating (e.g., electroplating or electroless plating) may be used to deposit or form the metal layer 150 on the surface of the showerhead 130 and on the walls of the holes 132 in the showerhead 130. Alternatively, a line-of-sight deposition technique such as sputtering may be used to form the metal layer. The metal layer 150 may be nickel, nickel doped with phosphorous, or nickel doped with vanadium in embodiments.

A barrier layer 152 covers the metal layer 150 at some or all regions of the surface of the showerhead 130. The barrier layer 152 may be formed using an oxidation process, which may be a dry oxidation process or a wet oxidation process (e.g., by dipping the showerhead 130 into a bath containing an oxidizing agent such as hydrofluoric acid or nitric acid. The barrier layer 152 may cover the metal layer on all surfaces of the chamber component, including on the inner walls of holes in the showerhead 130. The barrier layer may be a grown layer and may be conformal and uniform in embodiments. The uniform barrier layer may have a difference in thickness of less than about 10% across the surface of the showerhead in embodiments.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). The fluorine based gases may cause fluoride deposits to buildup on the holes of standard showerheads and/or a contamination layer to form on the holes of the showerheads. However, the holes 132 of showerhead 130 may be resistant to such fluoride buildup due to the barrier layer 152.

Referring back to FIG. 1A, a substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner may cover a periphery of the substrate support assembly 148. The inner liner may be a halogen-containing gas resist material such as $Al_2O_3$ or $Y_2O_3$. The substrate support assembly, portions of the substrate support assembly, and/or the inner liner may be coated with the metal layer and barrier layer in some embodiments.

Figure 2:
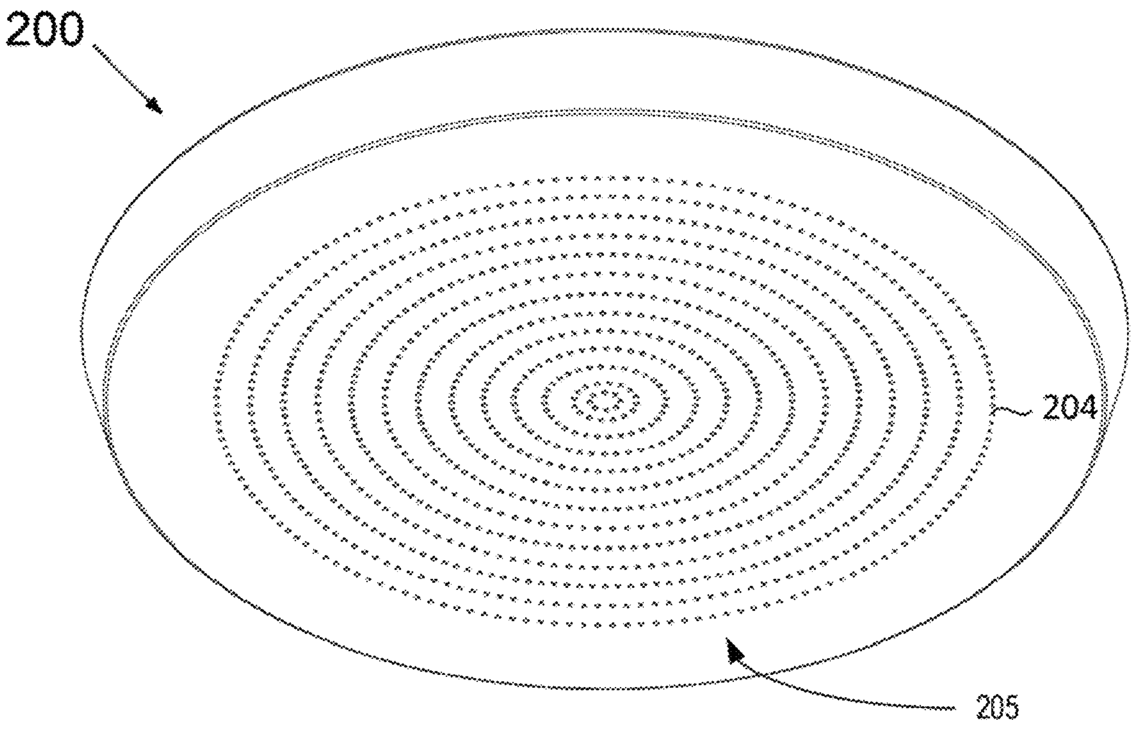
FIG. 2 illustrates one embodiment of a bottom view of a showerhead, in accordance with an embodiment.

FIG. 2 illustrates one embodiment of a bottom view of a showerhead 200. The showerhead 200 may have a series of gas conduits 204 (also referred to as holes) arranged concentrically that evenly distribute plasma gasses directly over a substrate or wafer to be etched or processed. The showerhead is depicted here having approximately 1100 gas conduits 204 arranged in evenly distributed concentric rings for even distributing of gasses. In another embodiment, the gas conduits 204 may be configured in alternative geometric configurations on the lower surface 205 of the showerhead (or on a lower surface of a GDP bonded to a showerhead). For example, the showerhead may have a square or rectangular configuration having rows and columns of gas conduits 204. It is to be understood that other shapes (e.g., triangle, pentagon, etc.) may be implemented and coated with a ceramic coating (e.g., an HPM coating) as described above. The showerhead 200 can have many gas conduits 204, as depicted, or as few gas conduits as appropriate depending on the type of reactor and/or process utilized.

In one embodiment, some or all gas conduits 204 do not include branches (e.g., each gas conduit may have a single entry point and a single exit point). Additionally, the gas conduits may have various lengths and orientation angles. Gas may be delivered to the gas conduits 204 via one or more gas delivery nozzles. Some gas conduits 204 may receive the gas before other gas conduits 204 (e.g., due to a proximity to a gas delivery nozzle). However, the gas conduits 204 may be configured to deliver gas to a substrate resting beneath the showerhead at approximately the same time based on varying the orientation angles, diameters and/or lengths of the gas conduits 204, or by using an additional flow equalizer. For example, gas conduits 204 that will receive gas first may be longer and/or have a greater angle (e.g., an angle that is further from 90 degrees) than conduits that will receive gas later.

Figure 3A:
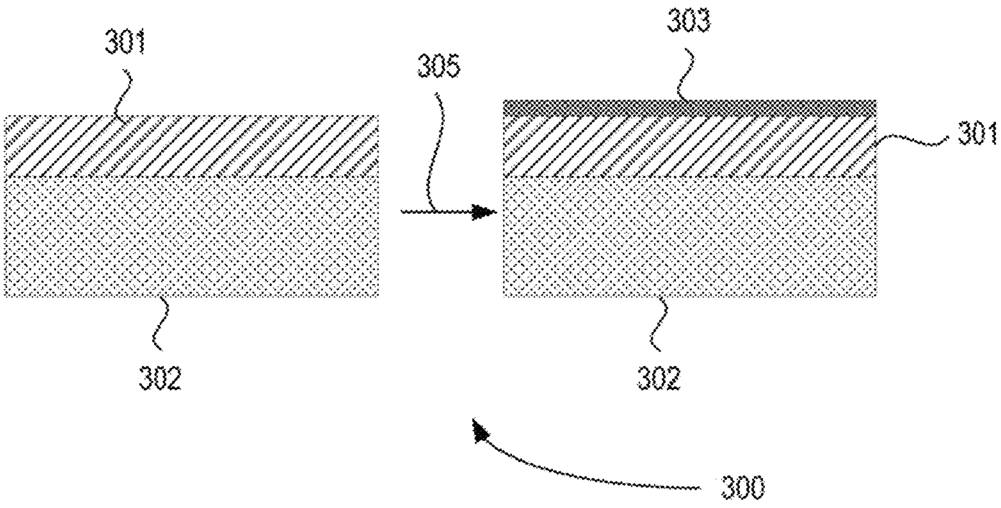
FIG. 3A illustrates a method of forming an advanced barrier oxide layer according to an embodiment.

As can be seen in FIG. 3A, a schematic 300 of oxidizing the metal plated coated chamber component is illustrated. In FIG. 3A, a metal plated chamber component includes a nickel layer 301 and a bare aluminum body 302 of the chamber component, wherein the nickel layer 301 is on a surface of the bare aluminum body 302. The metal plated chamber component undergoes an oxidation process 305 according to the present disclosure. After being oxidized, the metal plated chamber component includes a dense barrier layer 303 of nickel oxide on a surface of the nickel layer 301. The barrier layer 303 of NiO may prevent discoloration of the metal layer. The barrier layer 303 may also prevent as the chamber component from becoming a source of particles on processed substrates. The barrier layer 303 of NiO may also inhibit the reaction of fluorine with nickel in the nickel layer 301 to prevent the formation of a discolored/contaminated layer.

Further, the barrier layer 303 may prevent a native oxide from forming on the nickel layer 1.

In some embodiments, the chamber component may be a used chamber component that has been used to perform one or more processes on substrates, where the processes exposed the substrates to a fluorine-rich environment. The chamber component may not have been coated with a barrier layer prior to use. Accordingly, the chamber component may include a contamination layer over the metal layer 302. In some embodiments, the chamber component may be refurbished by removing the contamination layer to expose the metal layer, and then form the barrier layer over the metal layer. A schematic of such embodiment is illustrated in schematic 350 of FIG. 3B.

Figure 3B:
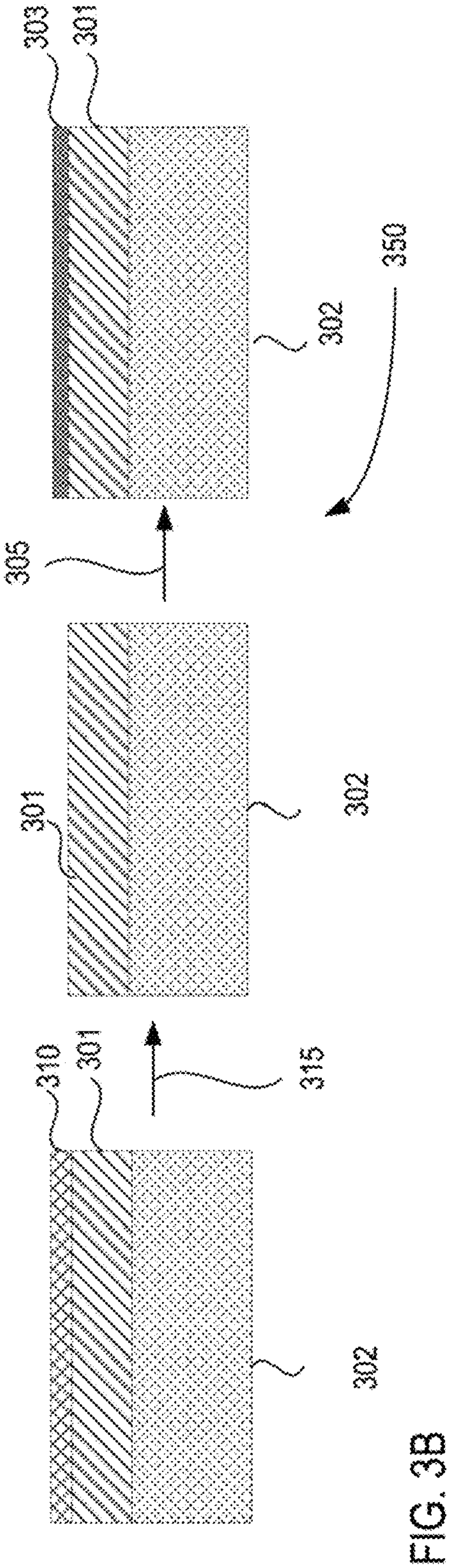
FIG. 3B illustrates another method of refurbishing and forming an advanced barrier oxide layer according to another embodiment.

In FIG. 3B, the chamber component includes an aluminum body 302 having a metal layer 301 disposed thereon, and a contamination layer 310 over the metal layer 301. The chamber component may undergo a cleaning process 315 to strip the contamination layer 310 from the metal layer 301. The chamber component having the cleaned metal layer 301 may then be processed using an oxidation process 305 to form barrier layer 303, as described in more detail in the present disclosure. After cleaning and oxidization, the contamination layer 310 is removed and a barrier layer 303 of dense nickel oxide is present over the metal layer 301.

Figure 4:
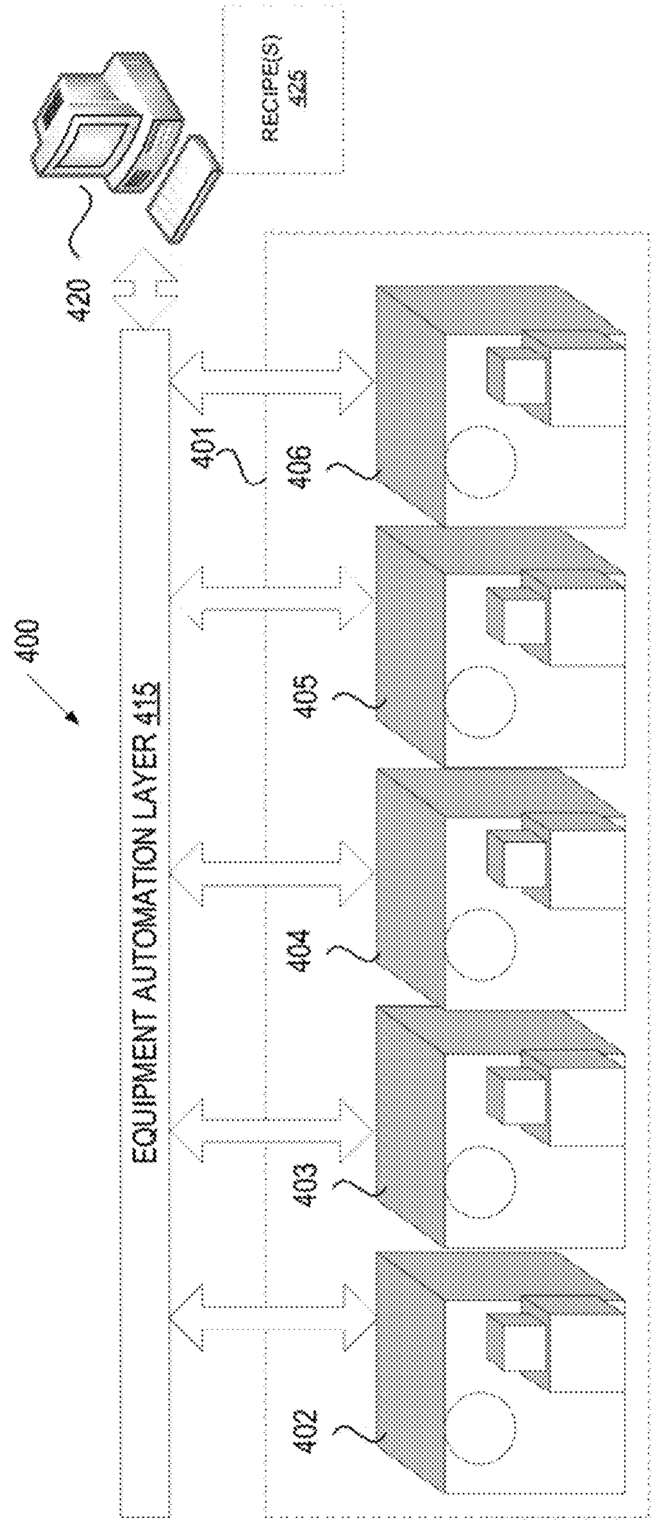
FIG. 4 illustrates an example architecture of a manufacturing system.

FIG. 4 illustrates an example architecture of a manufacturing system 400. The manufacturing system 400 may be a manufacturing system for applying platings and/or coatings to articles such as chamber components. In one embodiment, the manufacturing system 400 includes manufacturing machines 401 (e.g., processing equipment) connected to an equipment automation layer 415. The manufacturing machines may include a polisher 402, one or more wet cleaners 403, a plating system 404, a sputtering system 405, an oxidation system 406, and/or other machines. The manufacturing system 400 may further include one or more computing device 420 connected to the equipment automation layer 415. In alternative embodiments, the manufacturing system 400 may include more or fewer components. For example, the manufacturing system 400 may include manually operated (e.g., off-line) manufacturing machines 401 without the equipment automation layer 415 or the computing device 420.

Polisher 402 is a machine configured to polish or smoothen the surface of articles such as chamber components for processing chambers. Polisher 402 may be, for example, a chemical mechanical planarization (CMP) device or an abrasive polisher. For example, a motorized abrasive pad may be used to smoothen the surface of an article. A sander may rotate or vibrate the abrasive pad while the abrasive pad is pressed against a surface of the article. A roughness achieved by the abrasive pad may depend on an applied pressure, on a vibration or rotation rate and/or on a roughness of the abrasive pad.

Wet cleaners 403 are cleaning apparatuses that clean articles (e.g., articles) using a wet clean process. Wet cleaners 403 include wet baths filled with liquids, in which the substrate is immersed to clean the substrate. Wet cleaners 403 may agitate the wet bath using ultrasonic waves during cleaning to improve a cleaning efficacy. This is referred to herein as sonicating the wet bath.

In some embodiments, wet cleaners 403 include a first wet cleaner that contains deionized (DI) water and a second wet cleaner that contains an acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article having a metal layer with the acid solution prior to forming a barrier layer over the metal layer may improve a quality of the barrier layer formed over the metal layer. In one embodiment, an acid solution containing approximately 5 to 15 vol % HF is used to clean chamber components having a nickel layer. In one embodiment, an acid solution containing approximately 5 to 15 vol % $HNO_3$ is used to clean articles having a nickel layer.

The wet cleaners 403 may clean articles at multiple stages during processing. For example, wet cleaners 403 may clean an article after a substrate has been polished, before performing plating (e.g., electroplating), before forming a barrier layer over a metal plating, and so on.

In other embodiments, alternative types of cleaners such as dry cleaners may be used to clean the articles. Dry cleaners may clean articles by applying heat, by applying gas, by applying plasma, and so forth.

Plating system 404 is a system that performs electroplating (e.g., of Ni) or electroless plating (e.g., of Ni). Plating system 404 may be an electroplating system that applies a current to reduce dissolved metal cations so that they form a thin coherent metal coating on the article (e.g., on surfaces of a chamber component such as an aluminum chamber component). Specifically, the article to be plated may be the cathode of a circuit and a metal donor may be the anode of the circuit. The article and metal donor may be immersed in an electrolyte containing one or more dissolved metal salts and/or other ions that increase an electrical conductivity of the electrolyte. Metal from the metal donor than plates a surface of the article.

Another type of plating system that may be used is an electroless plating system that performs electroless plating. Electroless plating, also known as chemical or auto-catalytic plating, is a non-galvanic plating method that involves several simultaneous reactions in an aqueous solution, which occur without the use of external electrical power. The reaction is accomplished when hydrogen is released by a reducing agent, normally sodium hypophosphite or thiourea, and oxidized, thus producing a negative charge on the surface of the part.

The equipment automation layer 415 may interconnect some or all of the manufacturing machines 401 with computing devices 420, with other manufacturing machines, with metrology tools and/or other devices. The equipment automation layer 415 may include a network (e.g., a location area network (LAN)), routers, gateways, servers, data stores, and so on. Manufacturing machines 401 may connect to the equipment automation layer 415 via a SEMI Equipment Communications Standard/Generic Equipment Model (SECS/GEM) interface, via an Ethernet interface, and/or via other interfaces. In one embodiment, the equipment automation layer 415 enables process data (e.g., data collected by manufacturing machines 401 during a process run) to be stored in a data store (not shown). In an alternative embodiment, the computing device 420 connects directly to one or more of the manufacturing machines 401.

In one embodiment, some or all manufacturing machines 401 include a programmable controller that can load, store and execute process recipes. The programmable controller may control temperature settings, gas and/or vacuum settings, time settings, etc. of manufacturing machines 401. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the manufacturing machines 401 are programmed to execute recipes that will cause the manufacturing machines to polish an article, clean an article, plate an article, form a barrier layer on an article, and so on. In one embodiment, the manufacturing machines 401 are programmed to execute recipes that perform operations of a multi-step process for manufacturing an article having a metal layer and a barrier layer, as described with reference to FIGS. 5-6. The computing device 420 may store one or more plating, oxidizing, cleaning and/or polishing recipes 425 that can be downloaded to the manufacturing machines 401 to cause the manufacturing machines 401 to manufacture articles in accordance with embodiments of the present disclosure.

Figure 5:
FIG. 5 is a flow chart representing a method of forming an advanced barrier oxide layer according to an embodiment.

FIG. 5 is a flow chart representing a method 500 of refurbishing, and forming an advanced barrier oxide layer on, a chamber component according to an embodiment. Method 500 may be performed on chamber components having a metal layer (e.g., a metal plating) that has been used to perform one or more cycles of one or more manufacturing processes that expose the chamber component to chemistries that cause formation of a contamination layer on the metal layer. The contamination layer may contain oxygen, fluorine and/or one or more process elements. The contamination layer may cause particle contamination and/or negatively affect future processes performed in the process chamber in embodiments. Accordingly, in some embodiments of the present disclosure, when a contamination layer is present on the metal plated chamber component, the chamber component is placed in a first bath 502. The first bath may include water and a first acid (e.g., hydrofluoric acid, nitric acid ($HNO_3$), sulfuric acid ($H_2SO_4$), oxalic acid ($HC_2O_4$), or ammonium fluoride ($NH_4F$)). The hydrofluoric acid may be included in an amount from about 5 wt. % to about 15 wt. % in the bath based on the total composition of the first bath. The water may be included in an amount from about 85 wt. % to about 95 wt. % in the bath based on the total composition of the bath. In some embodiments, the first bath includes about 5 wt. % hydrofluoric acid and about 95 wt. % water. The first bath may be at a temperature from about 25° C. to about 35° C. The used metal plated chamber component may be placed in the first bath for about one minute to about 30 minutes to loosen the contamination layer. After soaking in the first bath, the metal plated chamber may include a loosened contamination layer. The metal plated chamber component may then be rinsed (e.g., with deionized water) to remove the loosened contamination layer and dried at block 504.

Subsequently, the metal plated chamber component is placed into the first bath or a second bath at block 506. The second bath includes water and an acid (e.g., hydrofluoric acid). The acid may be included in an amount from about 5 wt. % to about 15 wt. % in the bath based on the total composition of the first bath or second bath. The water may be included in an amount from about 85 wt. % to about 95 wt. % in the bath based on the total composition of the first bath or second bath. In some embodiments, the second bath includes about 5 wt. % hydrofluoric acid and about 95% water. The second bath may be at a temperature from about 25° C. to about 35° C. The used metal plated chamber component may be placed in the second bath for about one minute to about 30 minutes, where the remaining contamination layer may be removed. After the second bath, the metal plated chamber component may be rinsed (e.g., with deionized water) and dried 508.

The metal plated chamber component may then be polished after removing the contamination layer 510. The metal plated chamber component may be polished using an automatic polisher with different polishing sheets, such as a Scotch-Brite® sheet, or another advanced method to uniformly polish a surface. The metal plated coated chamber component may be polished until the surface roughness is about 10 pin to about 20 pin in one embodiment. After polishing, the metal plated coated chamber component may undergo an oxidation treatment 512. The oxidation treatment may be performed by placing the metal plated coated chamber component in a third bath. The third bath includes water and an acid (e.g., nitric acid ($HNO_3$), sulfuric acid ($H_2SO_4$), oxalic acid ($HC_2O_4$), or ammonium fluoride ($NH_4F$)). The acid may be included in an amount from about 5 wt. % to about 25 wt. % in the bath based on the total composition of the third bath. The water may be included in an amount form about 75 wt. % to about 95 wt. % in the bath based on the total composition of the third bath. In some embodiments, the third bath may include about 5 wt. % hydrofluoric acid and about 95 wt. % water. The third bath may be at a temperature from about 25° C. to about 35° C. The metal plated chamber component may be placed in the third bath for about one minute to about 30 minutes. The oxidized metal plated chamber component may be rinsed (e.g., with deionized water), where a nickel oxide layer may be formed on the surface of the metal plating layer. The nickel oxide layer may be between about 5 nanometers to about 35 nanometers in one embodiment.

Figure 6:
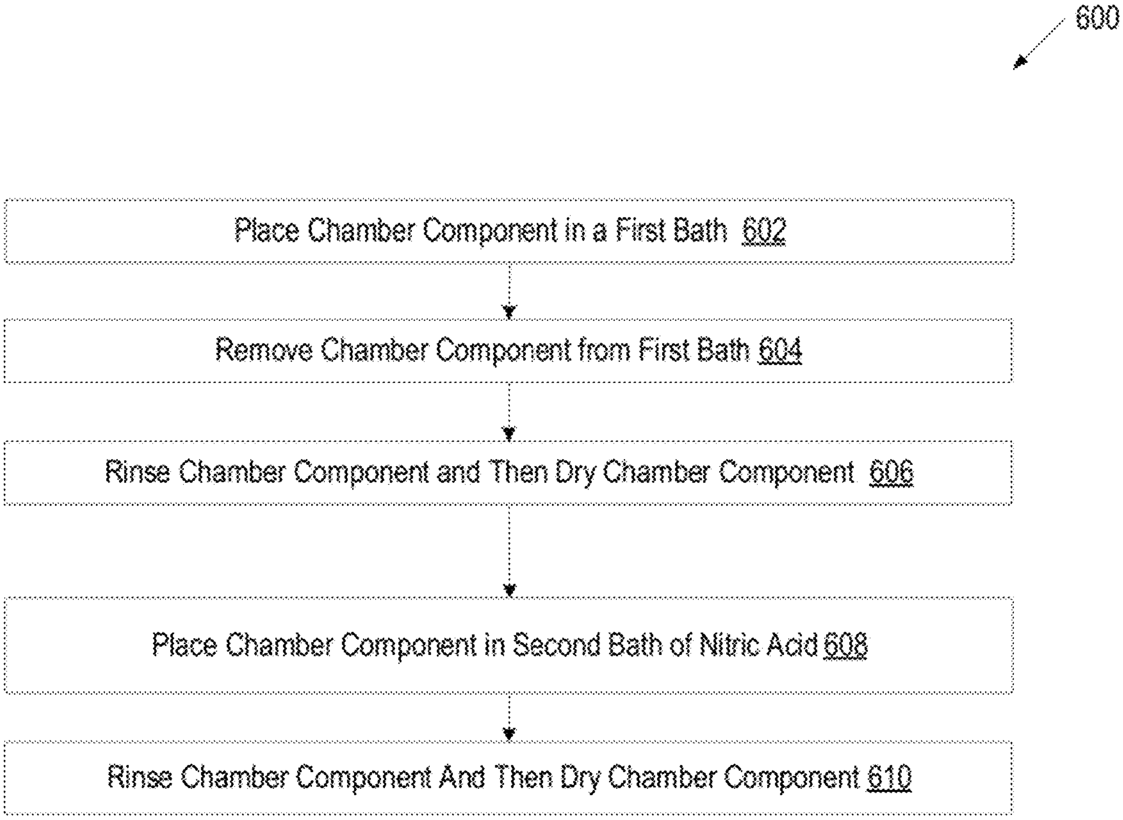
FIG. 6 is a flow chart representing a method of refurbishing and forming an advanced barrier layer according to another embodiment.

In another embodiment, the metal plated coated chamber component may be a new component, which may be oxidized through a second method 600. FIG. 6 is a flow chart representing a method of forming an advanced barrier layer on a metal plated or metal coated chamber component according to an embodiment. In the second method 600, the metal plated chamber component is placed in a first bath 602. The first bath may include water and an acid (e.g., hydrofluoric acid). The hydrofluoric acid may be included in an amount from about 5 wt. % to about 25 wt. % in the bath based on the total composition of the first bath. The water may be included in an amount form about 75 wt. % to about 95 wt. % in the bath based on the total composition of the bath. In some embodiments, the first bath includes about 5 wt. % hydrofluoric acid and about 95 wt. % water. The first bath may be at a temperature from about 25° C. to about 35° C. The metal plated chamber component may be placed in the first bath for about one minute to about 30 minutes. After the first bath 604, the metal plated chamber component may be rinsed (e.g., with deionized water) and dried 606.

Once dried, the metal plated chamber component may be treated with an acid (e.g., hydrofluoric acid or nitric acid ($HNO_3$)) to oxidize the metal plating layer and form a nickel oxide layer 608. The metal plated coated chamber component may be treated for a time from about one minute to about 30 minutes until a target thickness of the nickel oxide layer is achieved. The nickel oxide layer may be between about 5 nanometers to about 30 nanometers in embodiments, such as about 15 nanometers. The metal plated coated chamber component is then rinsed with deionized water and dried at block 610.

Figure 7:
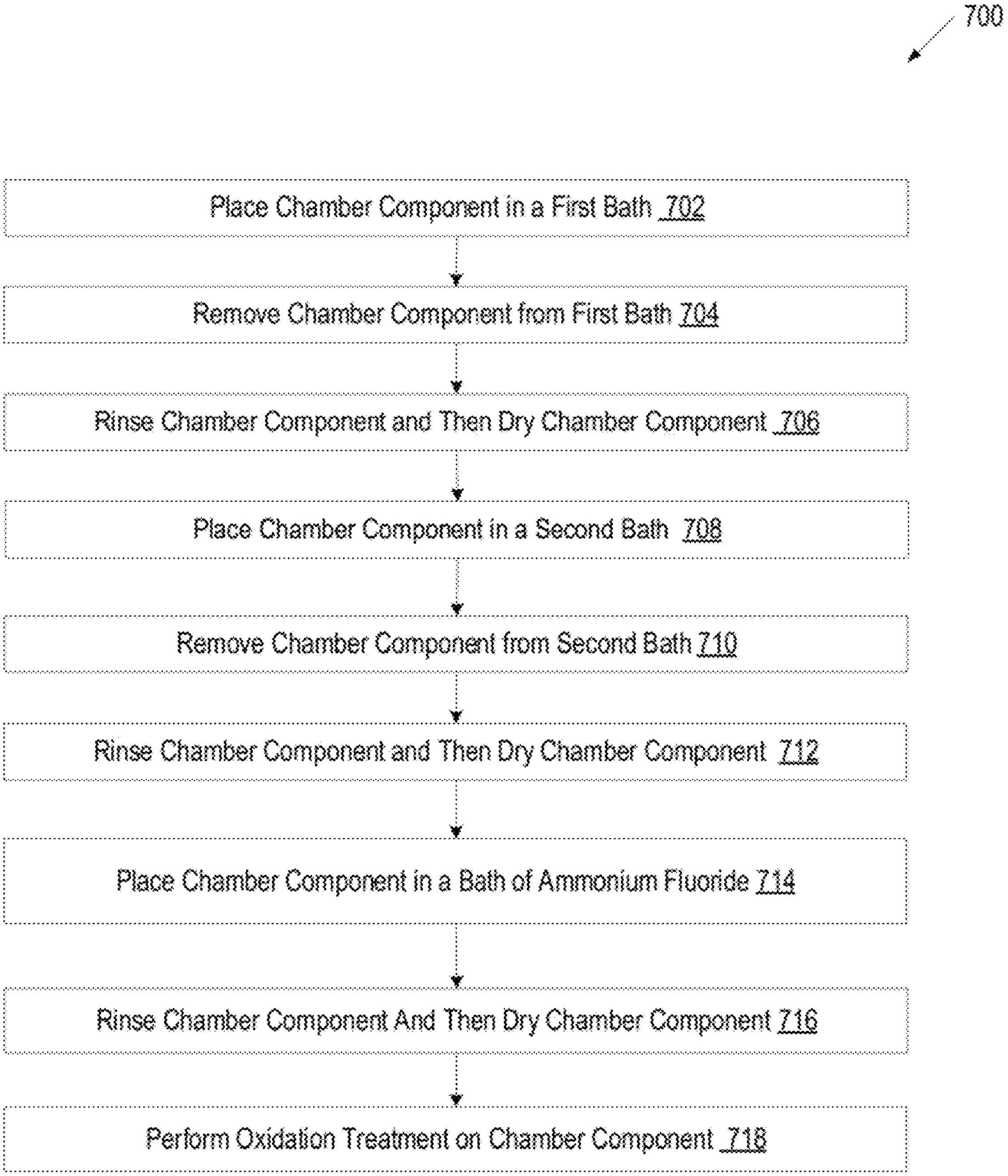
FIG. 7 is a flow chart representing a method of forming an advanced barrier layer on a metal plated or metal coated chamber component according to an embodiment.

In another embodiment, the metal plated coated chamber component may be a new component, having a nickel fluorinated or nickel oxy-fluorinated layer, and oxidizing the chamber component. FIG. 7 is a flow chart representing a method of forming an advanced barrier layer on a metal plated or metal coated chamber component having a nickel fluorinated ($NiF_2$) or nickel oxy-fluorinated (NiOF) layer according to an embodiment. The chamber component is placed in a first bath and rinsed in steps 702 to 706, as described in FIG. 6, steps 602 to 606. After rinsing and drying the chamber component, the chamber component is then placed in a second bath including an ammonium fluoride solution 708 to form a nickel fluorine or nickel oxy-fluorine layer. The ammonium fluoride solution has a concentration of about 0.5M to about 3 M. The chamber component remains in the second bath for about 5 minutes to about 60 minutes, where the second bath is at a temperature of about 35 to 45° C. to form a $NiF_2$ or NiOF layer. The chamber component is then removed from the bath 710. The chamber component is then rinsed and dried in step 712 as described above for step 606 in FIG. 6. After formation of the $NiF_2$ or NiOF layer, the chamber component may be treated with an acid (e.g., hydrofluoric acid or nitric acid ($HNO_3$)) to oxidize the metal plating layer 718 and form a nickel oxide layer as described above in steps 512 and 608 in FIGS. 5 and 6, respectively.

In another embodiment, the metal plated chamber component may be oxidized through an in situ method. This method may occur in the same chamber in which the chamber component is being coated with the nickel plated coating or in the chamber in which the part will be used. In a first step of the in situ method, the metal plated chamber component may be treated with a gas and moisture while the chamber component is in the chamber. The gas may be selected from the group consisting of $NH_3$, $NF_3$, HF or $H_2$, or a combination thereof. In some embodiments, the gas may be a combination of $NH_3$ and $NF_3$ or $NH_3$, $NF_3$ and HF. The gas may be in a concentration from about 5 sccm to about 2000 sccm of total gas. The gas reacts with the ambient moisture within the chamber. The temperature of the chamber be from about 150° C. to about 220° C. The nickel oxide coating layer may have a thickness of about 4 nm to about 50 nm.

By treating the part with an oxidation treatment to form a barrier layer as described herein, the inventors have found that the lifetime of the part may be more than 10 times that of the original coating that lacks the barrier layer. When an ENP coated layer chamber component is used, the standard lifetime is about 3000 cycles. When a barrier nickel oxide layer is present on the ENP coated layer, the lifetime of the part increases almost 10 times more than the standard lifetime of the part, where the lifetime is greater than 10,000 cycles.

Further, the inventors have found that the oxidation method can be used to coat a new part and for refurbishing an existing part where a contamination layer has formed.

ILLUSTRATIVE EXAMPLES

The following examples are set forth to assist in understanding the disclosure and should not be construed as specifically limiting the disclosure described and claimed herein. Such variations of the disclosure, including the substitution of all equivalents now known or later developed, which would be within the purview of those skilled in the art, and changes in formulation or minor changes in experimental design, are to be considered to fall within the scope of the disclosure incorporated herein.

Example 1—Pretreatment of an ENP Coated Showerhead

Exemplified herein is a showerhead having a nickel plating and a nickel oxide barrier layer on the nickel plating. The showerhead was first coated with nickel layer using a metal plating process. A natural oxide layer was formed on the nickel plating prior to formation of an intentional nickel oxide layer. The natural nickel oxide layer has inferior properties and impedes the formation of a target nickel oxide layer that will reduce particle contamination and improve a lifespan of the chamber component. The native nickel oxide layer may have a thickness of about 2 to 3 nm. The showerhead then underwent an oxidization treatment in which the showerhead was placed in a bath of 5% (5%-25%) hydrofluoric acid and 95% water at a temperature between 25 to 35° C. After 40 minutes, the showerhead was removed from the bath and rinsed with deionized water. A barrier nickel oxide layer was formed over the nickel layer. The barrier nickel oxide (NiO) layer on the metal layer had a thickness of from about 6 nm to about 22 nm.

Example 2—Cleaning and Oxidizing of an ENP Coated Showerhead

Exemplified herein is a showerhead comprising a nickel plating (a nickel ENP) that has been used, where a contamination layer has formed on the showerhead as a result of the use. The total thickness of the contamination layer (i.e., a fluorinated or oxy-fluorinated layer) was greater than 5 to 200 nm.

The showerhead was cleaned to remove the contamination layer by placing the showerhead in a first bath of 5% (5%-25%) hydrofluoric acid and 95% water for 40 minutes at 25 to 40° C. The showerhead was then removed from the fist bath and rinsed with deionized water and dried. After it was dried, the showerhead was then placed in a second bath of 25% hydrofluoric acid and 75% water for 40 minutes at 25 to 40° C. The showerhead was then removed from the second bath and rinsed again with deionized water and dried.

The contamination layer was removed from the showerhead as a result of the cleaning. The showerhead was then treated and oxidized by placing the showerhead in a bath of 5% hydrofluoric acid to form a barrier layer over the ENP layer. A barrier nickel oxide layer was formed on the ENP layer as a result of the treatment and oxidation. The barrier nickel oxide (NiO) layer on the ENP coating layer had a combined thickness of about 22 nm. An EDS line profile of the barrier NiO layer on the ENP layer showed that nickel was present in the barrier NiO layer and there was no phosphorous in such layer. A TEM image and an EDS line profile of an inside of a small hole of the showerhead was also taken, and showed that the barrier layer had a thickness between 6.3 nm to 31.2 nm.

The barrier layer on the backside of the showerhead was also measured to have a thickness of about 19 to 30 nm. This was also shown in an EDS line profile. This confirms that the barrier nickel oxide layer was formed along the entire showerhead, and was not limited to only the front side of the showerhead.

Example 3—Fluorination and Oxidizing of an ENP Coated Showerhead

Exemplified herein is a showerhead comprising a nickel plating (a nickel ENP) coating that is treated with ammonium fluoride ($NH_4F$) solution having a concentration of 0.5M to 3M to convert a fluorinated ($NiF_2$) or oxidized-fluorinated (NiOF) layer having a thickness of about 6 nm to about 50 nm. The showerhead underwent an oxidization treatment in which the showerhead was placed in a bath of 5% (5%-25%) hydrofluoric acid and 95% water at a temperature between 25 to 35° C. to have a NiO thickness of about 6 nm to about 50 nm.

SEM images were also taken of the barrier layer on the ENP coated showerhead. From the SEM images, the weight percent of C, O, P and Ni were calculated and are presented in Table 1. It is noted that P comes from the ENP layer.

TABLE 1

| Element | Weight % | Atomic % |
|---|---|---|
| C K | 12.62 | 35.92 |
| O K | 4.08 | 8.72 |
| P K | 13.16 | 14.52 |
| Ni K | 70.14 | 40.84 |
| Totals | | 100.00 |

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of protecting a chamber component of a plasma etcher, comprising:
- forming a metal plating on a body of the chamber component, wherein the metal plating comprises nickel, and
- contacting the metal plating with an acid bath comprising 5 to 25 wt % of an oxidizing agent comprising hydrofluoric acid and 75 to 95 wt % water to form a barrier layer on the metal plating, wherein the barrier layer comprises nickel oxide and has a thickness of about 2 nm to about 50 nm,
- wherein the chamber component comprises a lid, a nozzle, an electrostatic chuck, or a showerhead.

2. The method of claim 1, wherein the oxidizing agent further comprises oxalic acid, or nitric acid.

3. The method of claim 1, wherein forming the metal plating comprises performing electroless metal plating, and wherein the metal plating further comprises phosphorus.

4. The method of claim 1, wherein the body comprises an aluminum alloy, aluminum nitride, alumina, or combinations thereof.

5. The method of claim 1, further comprising:
- removing a native oxide from the metal plating prior to forming the barrier layer.

6. The method of claim 1, further comprising after the forming the metal plating, forming a nickel fluoride ($NiF_2$) or nickel oxy-fluoride layer on the metal plating by contacting the metal plating with ammonium fluoride.

7. The method of claim 1, further comprising:
- after contacting the metal plating with the acid bath, subsequently placing the chamber component in a de-ionized water bath;
- subsequently placing the chamber component in the acid bath; and
- subsequently placing the chamber component in the di-ionized water bath.

8. The method of claim 7, wherein the acid bath is at a temperature of about 25° C. to about 35° C.

9. A method of refurbishing a used chamber component of a plasma etcher, comprising:

removing a contamination layer from a metal plating on the used chamber component using a first acid solution, wherein the metal plating comprises nickel; and subsequently contacting the metal plating with an acid bath comprising 5 to 25 wt % an oxidizing agent comprising hydrofluoric acid and 75 to 95 wt % water to form a barrier layer on the metal plating, wherein the barrier layer comprises nickel oxide and has a thickness of about 2 nm to about 50 nm, wherein the chamber component comprises a lid, a nozzle, an electrostatic chuck, or a showerhead.

10. The method of claim 9, wherein the contamination layer comprises nickel fluoride.

11. The method of claim 10, wherein the removing the contamination layer comprises:

placing the used chamber component in a first acid bath, subsequently rinsing the used chamber component with deionized water, subsequently drying the used chamber component, subsequently placing the used chamber component in a second acid bath, subsequently rinsing the used chamber component with deionized water, and subsequently drying the used chamber component.

12. The method of claim 11, wherein the first acid bath and the second acid bath are at a temperature of 25° C. to 40° C.

13. The method of claim 9, wherein the oxidizing agent further comprises nitric acid.

* * * * *